(12) United States Patent
Ihn et al.

(10) Patent No.: US 8,941,007 B2
(45) Date of Patent: Jan. 27, 2015

(54) ELECTRON DONATING POLYMER AND ORGANIC SOLAR CELL INCLUDING THE SAME

(75) Inventors: Soo-Ghang Ihn, Hwaseong-si (KR); Yeong-Suk Choi, Suwon-si (KR); Youn-Hee Lim, Nowon-gu (KR); Bulliard Xavier, Suwon-si (KR); Sung-Young Yun, Suwon-si (KR); In-Sun Park, Seoul (KR); Yeon-Ji Chung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/421,198

(22) Filed: Mar. 15, 2012

(65) Prior Publication Data

US 2013/0087202 A1    Apr. 11, 2013

(30) Foreign Application Priority Data

Oct. 5, 2011    (KR) ........................ 10-2011-0101268

(51) Int. Cl.
*H01L 31/00* (2006.01)
*C08G 63/688* (2006.01)
*C07D 333/00* (2006.01)
*C07D 495/02* (2006.01)
*H01L 51/00* (2006.01)
*H01L 51/42* (2006.01)

(52) U.S. Cl.
CPC ......... *H01L 51/0036* (2013.01); *H01L 51/0047* (2013.01); *H01L 51/4253* (2013.01); *Y02E 10/549* (2013.01)
USPC ................. 136/263; 528/360; 549/50; 549/57

(58) Field of Classification Search
USPC .................. 136/263; 528/360; 549/50, 57
See application file for complete search history.

(56) References Cited

U.S. PATENT DOCUMENTS

| | | | |
|---|---|---|---|
| 4,125,414 A | 11/1978 | Tang et al. |
| 4,175,981 A | 11/1979 | Loutfy et al. |
| 4,329,535 A | 5/1982 | Rapp |
| 4,356,429 A | 10/1982 | Tang |
| 4,913,744 A | 4/1990 | Hoegl et al. |
| 6,913,710 B2 | 7/2005 | Farrand et al. |
| 7,071,289 B2 | 7/2006 | Sotzing |
| 7,118,692 B2 | 10/2006 | Nordquist et al. |
| 7,147,936 B2 | 12/2006 | Louwet et al. |
| 7,183,418 B2 | 2/2007 | Heeney et al. |
| 7,244,809 B2 | 7/2007 | Giles et al. |
| 7,432,340 B2 | 10/2008 | Zahn et al. |
| 7,470,377 B2 | 12/2008 | Heeney et al. |
| 7,507,764 B2 | 3/2009 | Hirsch |
| 7,524,922 B2 | 4/2009 | Heeney et al. |
| 7,541,425 B2 | 6/2009 | Heeney et al. |
| 7,572,879 B2 | 8/2009 | Zahn et al. |
| 7,667,230 B2 | 2/2010 | Zhu et al. |
| 7,700,643 B2 | 4/2010 | Heeney et al. |
| 7,714,098 B2 | 5/2010 | Heeney et al. |
| 7,754,847 B2 | 7/2010 | Chan et al. |
| 7,781,673 B2 | 8/2010 | Gaudiana et al. |
| 7,838,624 B2 | 11/2010 | Laird et al. |
| 2005/0022856 A1 | 2/2005 | Komatsu et al. |
| 2005/0061364 A1 | 3/2005 | Peumans et al. |
| 2005/0143327 A1 | 6/2005 | Hirsch |
| 2006/0289058 A1 | 12/2006 | Skabara et al. |
| 2008/0087326 A1 | 4/2008 | Scholes et al. |
| 2008/0102559 A1 | 5/2008 | Ong et al. |
| 2008/0103286 A1 | 5/2008 | Ong et al. |
| 2008/0154019 A1 | 6/2008 | Hwang et al. |
| 2008/0213324 A1 | 9/2008 | Zhou et al. |
| 2008/0315751 A1 | 12/2008 | Sheina et al. |
| 2009/0221740 A1 | 9/2009 | Sheina |
| 2009/0299029 A1 | 12/2009 | Chan et al. |
| 2010/0006154 A1 | 1/2010 | Kitazawa et al. |
| 2010/0032018 A1 | 2/2010 | Zhu et al. |
| 2010/0243051 A1 | 9/2010 | Slager |
| 2010/0292433 A1 | 11/2010 | Chen et al. |
| 2011/0006287 A1 | 1/2011 | You et al. |
| 2011/0017956 A1 | 1/2011 | Hou et al. |
| 2011/0114159 A1 | 5/2011 | Smith et al. |
| 2011/0132440 A1 | 6/2011 | Sivarajan et al. |
| 2011/0315224 A1 | 12/2011 | Choi et al. |
| 2011/0315225 A1 | 12/2011 | Choi et al. |

FOREIGN PATENT DOCUMENTS

| | | |
|---|---|---|
| EP | 1 916 250 | 4/2008 |
| JP | 2009-060051 A | 3/2009 |
| KR | 10-0872957 B | 12/2008 |
| KR | 20110140525 A | 1/2012 |
| KR | 20110140552 A | 1/2012 |
| WO | WO 2009/051275 A1 | 4/2009 |
| WO | WO 2009/052215 A1 | 4/2009 |

(Continued)

OTHER PUBLICATIONS

European Search Report dated Oct. 12, 2011, in corresponding European Patent Application No. 11171285.7.
European Search Report dated Sep. 17, 2012, in corresponding European Patent Application No. 12168879.0.
Hou, J., et al. "Synthesis of a Low Band Gap Polymer and Its Application in Highly Efficient Polymer Solar Cells." J. Am. Chem. Soc. 2009, 131, 15586-15587, XP-002660031.
Huo, L., et al., "Replacing Alkoxy Groups with Alkylthienyl Groups: A Feasible Approach to Improve the Properties of Photovoltaic Polymers," Angewandte Chemie International Edition, vol. 50, No. 41, pp. 9697 to 9702 (Oct. 4, 2011).
Kim, K.J., et al."Passivation films with SU-8 polymers for organic solar cell protection from ultraviolet ray", Solar Energy Materials and Solar Cells, vol. 95, pp. 1238-1242, Feb. 3, 2011.

(Continued)

*Primary Examiner* — Kristin Vajda
*Assistant Examiner* — Valerie Rodriguez-Garcia
(74) *Attorney, Agent, or Firm* — Harness, Dickey & Pierce, P.L.C.

(57) ABSTRACT

A polymer, and an organic solar cell including the polymer, include a repeating unit A represented by Chemical Formula 1, and a repeating unit B represented by Chemical Formula 2.

14 Claims, 4 Drawing Sheets

(56) References Cited

FOREIGN PATENT DOCUMENTS

| WO | WO 2009/104781 A1 | 8/2009 |
|---|---|---|
| WO | WO 2009/152165 A2 | 12/2009 |
| WO | WO 2010/008672 A1 | 1/2010 |
| WO | WO 2010/136401 A2 | 12/2010 |
| WO | WO 2012/003919 A2 | 1/2012 |

OTHER PUBLICATIONS

Kleinhenz, N., et al., "Low-Band Gap Polymers That Utilize Quinoid Resonance Structure Stabilization by Thienothiophene: Fine-Tuning of HOMO level," Macromolecules, vol. 44, No. 4, pp. 872-877 (Feb. 22, 2011).

Liang, Y., et al., "For the Bright Future—Bulk Heterojunction Polymer Solar Cells with Power Conversion Efficiency of 7.4%", Adv. Mater. 2010, pp. E135-E138, Jan. 4, 2010.

Liang, Yongye, et al. "Highly Efficient Solar Cell Polymers Developed via Fine-Tuning of Structural and Electronic Properties." J. Am. Chem. Soc. 2009, 131, 7792-7799, XP-002660032.

Peet, J., et al., "Efficiency enhancement in low-bandgap polymer solar cells by processing with alkane dithols", nature materials, vol. 6 Jul. 2007, pp. 497-500, May 27, 2007.

Pomerantz, M. and Gu, X., "Poly(2-decylthieno[3,4-b]thiophene). A New Soluble Low-Bandgap Conducting Polymer", Synthetic Metals, vol. 84, 1997, pp. 243-244.

Ryu, M.-S., et al. "Improvement of operation lifetime for conjugated polymer:fullerene organic solar cells by introducing a UV absorbing film", Solar Energy Materials & Solar Cells, vol. 94, pp. 152-156, Sep. 4, 2009.

Scharber, M. C. et al., "Design Rules for Donors in Bulk-Heterojunction Solar Cells—Towards 10% Energy-Conversion Efficiency", Advanced Materials, 2006, vol. 18, pp. 789-794.

Wynberg, H. et al., "Synthesis of an Asymmetric Heterotriptycene", The Journal of Organic Chemistry, vol. 35, No. 3, Mar. 1970, pp. 711-715.

Yamamoto, T., et al., "Synthesis and Characterization of Thieno[3,4-b]thiophene-Based Copolymers Bearing 4-Substituted Phenyl Ester Pendants: Facile Fine-Tuning of HOMO Energy Levels," Macromolecules, vol. 44, No. 17, pp. 6659-6662, (Sep. 13, 2011).

Zilio, S.D., et al., "Fabrication of a light trapping system for organic solar cells", Microelectronic Engineering, vol. 86, pp. 1150-1154, Feb. 11, 2009.

C.W. Tang; "Two-layer organic photovoltaic cell"; Applied Physics Letters, vol. 48, p. 183-185, 1986.

"Perylene Spec Sheet"; LookChem.com; 2008 <http://www.lookchem.com/cas-198/198-55-0.html>.

"Tetraphenylbutadiene Spec Sheet"; LookChem.com; 2008 <http://www.lookchem.com/1-1-4-4-Tetraphenylbutadiene/>.

S. Prahl; "Coumarin Absorption/Emission Spectra"; Oregon Medical Laser Center; Mar. 2012; <http://omlc.ogi.edu/spectra/PhotochemCAD/html/045.html>.

V. Gehman, et al.; "Fluorescence efficiency and visible re-emission spectrum of tetraphenyl butadiene films at extreme ultraviolet wavelengths"; Nuclear Instruments and Methods in Physics Research Section A: Accelerators, Spectrometers, Detectors, and Associated Equipment, vol. 654, p. 116-121; 2011.

"Dhanveen Pigments Copper Phthalocyanine Spec Sheet"; Dhanveen Pigments Pvt. Ltd.; 2013; <http://www.dhanveenpigments.com/copper-phthalocyanine-crude-cpc-blue--306522.html>.

F. Saunders, "Crystalline poly-p-tert-butylstyrene"; Journal of Polymer Science Part A-1, vol. 5; 1967.

Office Action dated Feb. 27, 2014 for co-pending U.S. Appl. No. 13/371,933.

Office Action issued in corresponding U.S. Appl. No. 13/166,435 on Apr. 8, 2014.

US Office Action dated Dec. 23, 2013 corresponding to U.S. Appl. No. 13/477,850.

Liang et al., "Development of New Semiconducting Polymers for High Performance Solar Cell", J. Am. Chem. Soc., 2009, 131, pp. 56-57, and supplemental information.

Sajadi et al., "Time-resolved fluorescence spectra of cis-stilbene in hexane and acetonitrile", Chemical Physics Letters, 489 (2010), pp. 44-47.

Prahl, "Absorption and Emission Spectra for Trans-stilbene"; Mar. 5, 2012.

Wu et al., "An ultraviolet responsive hybrid solar cell based on titania/Poly (3-hexylthiophene", Scientific Reports 3: 1283, Feb. 15, 2013, pp. 1-6.

US Office Action dated Jul. 31, 2013 corresponding to U.S. Appl. No. 13/371,933.

Advisory Action and Interview Summary dated Jun. 19, 2014 issued in co-pending U.S. Appl. No. 13/371,933.

Nov. 26, 2014 Office Action issued in U.S. Appl. No. 13/371,933.

Wang, Nature, 1992, vol. 356, pp. 585-587.

D'Angelo, et al., Solid-State Electronics, 2007, vol. 51, pp. 123-129.

ELECTRON DONATING POLYMER AND ORGANIC SOLAR CELL INCLUDING THE SAME

CROSS-REFERENCE TO RELATED APPLICATION

This application claims priority, under 35 U.S.C. §119, to and the benefit of Korean Patent Application No. 10-2011-0101268 filed in the Korean Intellectual Property Office on Oct. 5, 2011, the entire contents of which are incorporated herein by reference.

BACKGROUND

1. Field

Example embodiments are directed to an electron donating polymer and an organic solar cell including the same.

2. Description of the Related Art

A solar cell is a photoelectric conversion device that transforms solar energy into electrical energy, and has attracted much attention as an infinite but pollution-free next generation energy source.

A solar cell includes p-type and n-type semiconductors. A solar cell produces electrical energy by transferring electrons and holes to the n-type and p-type semiconductors, respectively, and then collecting electrons and holes in each electrode when an electron-hole pair (EHP) is produced by solar light energy absorbed in a photoactive layer inside the semiconductors.

A solar cell may be classified as an organic solar cell or an inorganic solar cell depending on the materials used for a thin film. The organic solar cell may be classified as a bi-layer p-n junction structure in which a p-type semiconductor is formed in a separate layer from an n-type semiconductor, or a bulk heterojunction structure in which a p-type semiconductor is mixed with an n-type semiconductor.

SUMMARY

Example embodiments are directed to an electron donating polymer and an organic solar cell including the same.

Example embodiments provide an electron donating polymer capable of absorbing light with a wide wavelength region, easily dissolvable in an organic solvent, and having excellent miscibility with an electron acceptor.

Other example embodiments provide an organic solar cell being capable of increasing a light absorption rate and short circuit current density (Jsc), thereby improving efficiency of the organic solar cell.

According to example embodiments, provided is a polymer that includes a repeating unit A represented by the following Chemical Formula 1 and a repeating unit B represented by the following Chemical Formula 2.

CHEMICAL FORMULA 1

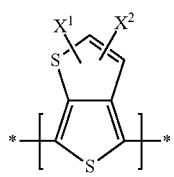

In Chemical Formula 1, $X^1$ is the same or different in each repeating unit, and is independently a group including at least two ester residual groups and a substituted or unsubstituted divalent aliphatic organic group linking the at least two ester residual groups, and $X^2$ is the same or different in each repeating unit, and is independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and $-SR^{100}$, wherein $R^{100}$ is one selected from a substituted or unsubstituted C1 to C20 aliphatic organic group, a substituted or unsubstituted C2 to C30 aromatic organic group, and a substituted or unsubstituted C2 to C30 heterocycloalkyl group.

Chemical Formula 2

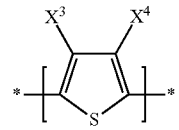

In Chemical Formula 2, $X^3$ and $X^4$ are the same or different, and are each independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and $-SR^{101}$, wherein $R^{101}$ is one selected from a substituted or unsubstituted C1 to C20 aliphatic organic group, a substituted or unsubstituted C2 to C30 aromatic organic group, and a substituted or unsubstituted C2 to C30 heterocycloalkyl group.

The polymer is an electron donating polymer. The group including the at least two ester residual groups and the substituted or unsubstituted divalent aliphatic organic group is an electron accepting group.

In Chemical Formula 2, the $X^3$ and $X^4$ may be the same or different, and may each be independently one selected from hydrogen, a halogen, a substituted or unsubstituted C1 to C15 alkyl group, a substituted or unsubstituted C1 to C15 alkoxy group, and $-SR^{102}$, wherein $R^{102}$ may be a substituted or unsubstituted C1 to C15 alkyl group.

The electron accepting group including at least two ester residual groups and a substituted or unsubstituted divalent aliphatic organic group linking the ester residual groups may be a functional group represented by the following Chemical Formula 3 or 4.

Chemical Formula 3

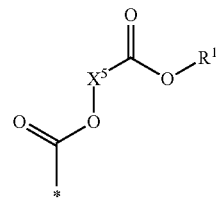

Chemical Formula 4

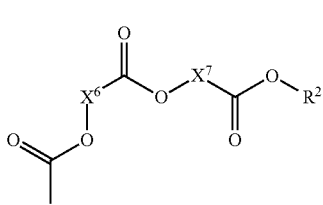

In Chemical Formulas 3 and 4, $X^5$ to $X^7$ are the same or different, and are each independently a substituted or unsubstituted divalent C1 to C20 aliphatic organic group, and $R^1$ and $R^2$ are the same or different, and are each independently one selected from hydrogen, and substituted or unsubstituted C1 to C20 aliphatic organic group.

The repeating unit A may include one selected from a repeating unit represented by the following Chemical Formula 5-1, a repeating unit represented by the following Chemical Formula 5-2, and a combination thereof.

Chemical Formula 5-1

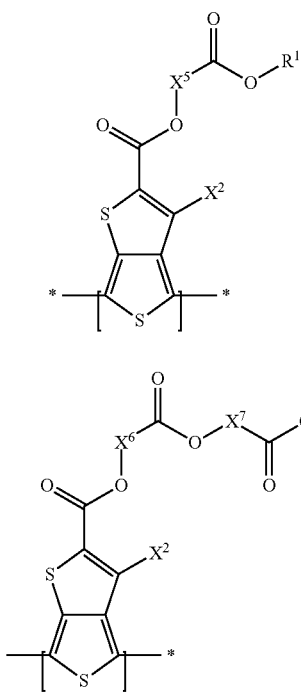

Chemical Formula 5-2

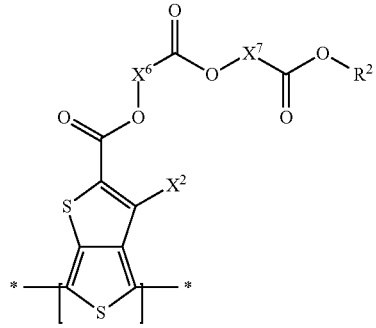

In Chemical Formulas 5-1 and 5-2, $X^2$ is the same or different in each repeating unit, and is independently one selected from hydrogen, a halogen, and a substituted or unsubstituted C1 to C20 alkyl group, $X^5$ to $X^7$ are the same or different and are each independently a substituted or unsubstituted divalent C1 to C10 aliphatic organic group, and $R^1$ and $R^2$ are the same or different, and are each independently one selected from hydrogen, and a substituted or unsubstituted C1 to C10 aliphatic organic group.

In example embodiments, the repeating unit A may include one selected from a repeating unit represented by the following Chemical Formula 6-1, a repeating unit represented by the following Chemical Formula 6-2, and a combination thereof, and the repeating unit B may include one selected from repeating units represented by the following Chemical Formulas 7-1 to 7-4, and a combination thereof.

Chemical Formula 6-1

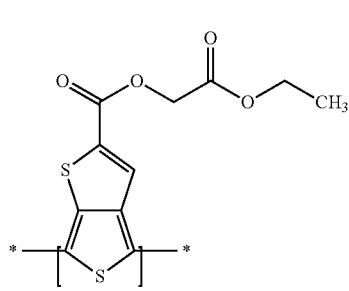

Chemical Formula 6-2

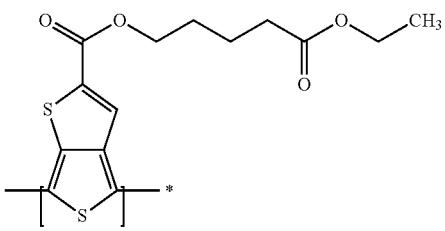

Chemical Formula 7-1

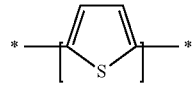

Chemical Formula 7-2

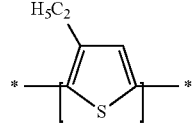

Chemical Formula 7-3

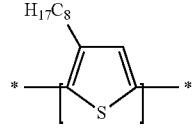

Chemical Formula 7-4

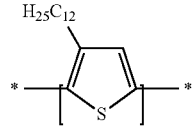

The polymer may include the repeating unit A and the repeating unit B in a mole ratio of about 1:0.5 to about 1:2.5.

The electron donating polymer may include the repeating unit A and the repeating unit B in a mole ratio of about 1:1 to about 1:2.

The repeating unit A and the repeating unit B may collectively form a repeating unit C. The repeating unit C may be one selected from repeating units represented by the following Chemical Formulas 8-1 to 8-4, and a combination thereof.

Chemical Formula 8-1

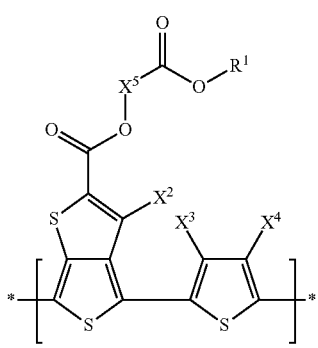

-continued

Chemical Formula 8-2

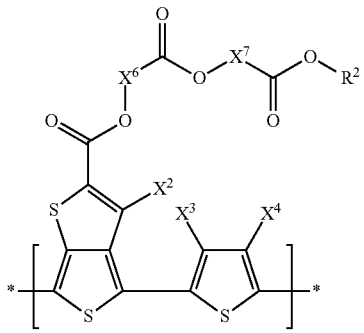

Chemical Formula 8-3

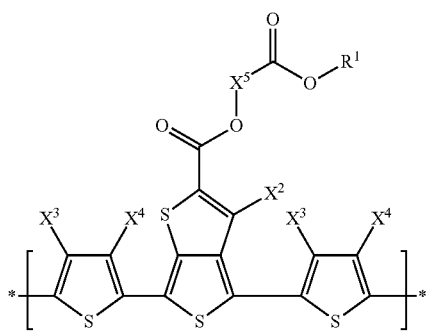

Chemical Formula 8-4

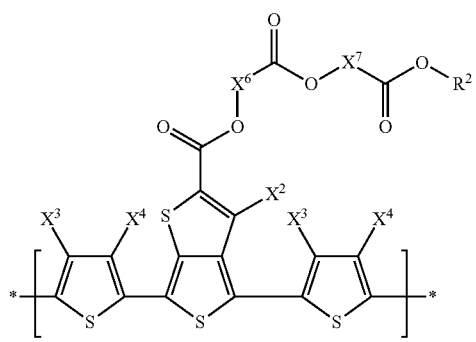

In Chemical Formulas 8-1 to 8-4, $X^2$ is the same or different in each repeating unit, and is independently one selected from hydrogen, a halogen, and a substituted or unsubstituted C1 to C20 alkyl group. $X^3$ and $X^4$ are the same or different, and are each independently one selected from hydrogen, halogen, a substituted or unsubstituted C1 to C15 alkyl group, a substituted or unsubstituted C1 to C15 alkoxy group, and —$SR^{102}$, wherein $R^{102}$ is a substituted or unsubstituted C1 to C15 alkyl group. $X^5$ to $X^7$ are the same or different, and are each independently a substituted or unsubstituted divalent C1 to C10 aliphatic organic group. $R^1$ and $R^2$ are the same or different, and are each independently one selected from hydrogen, and a substituted or unsubstituted C1 to C10 aliphatic organic group.

In example embodiments, the repeating unit A and the repeating unit B may collectively form a repeating unit C. The repeating unit C may include one selected from a repeating unit represented by the following Chemical Formula 9-1, a repeating unit represented by the following Chemical Formula 9-2, and a combination thereof.

Chemical Formula 9-1

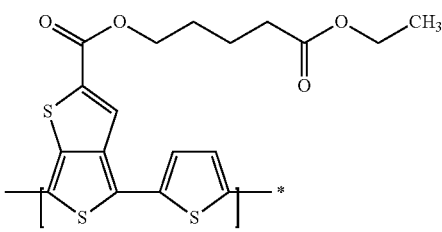

Chemical Formula 9-2

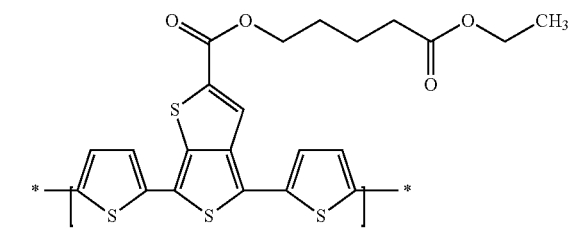

The polymer may have a number average molecular weight (Mn) of about 500 g/mol to about 800,000 g/mol.

The polymer may have a number average molecular weight (Mn) of about 5,000 g/mol to about 50,000 g/mol.

The polymer may have a bandgap of about 1.2 eV to about 2.5 eV.

The polymer may have a bandgap of about 1.35 eV to about 1.6 eV.

The repeating unit A may be an electron accepting unit, and the repeating unit B may be an electron donating unit.

The substituted or unsubstituted divalent aliphatic organic group may be a nonpolar group.

The at least two ester residual groups may be polar groups.

According to example embodiments, an organic solar cell includes an anode and a cathode facing each other, and a photoactive layer between the anode and the cathode. The photoactive layer includes an electron donor including the polymer, and an electron acceptor.

The electron donor may include a p-type semiconductor material, and the electron acceptor may include an n-type semiconductor material.

The electron acceptor may be one selected from a C60 fullerene, a C70 fullerene, a C74 fullerene, a C76 fullerene, a C78 fullerene, a C82 fullerene, a C84 fullerene, a C720 fullerene, a C860 fullerene, 1-(3-methoxy-carbonyl)propyl-1-phenyl(6,6)C61 (PCBM), C71-PCBM, C84-PCBM, bis-PCBM, perylene, an inorganic semiconductor, combinations and derivatives thereof.

BRIEF DESCRIPTION OF THE DRAWINGS

Example embodiments will be more clearly understood from the following detailed description taken in conjunction with the accompanying drawings.

FIG. 1 is a cross-sectional view showing an organic solar cell according to example embodiments;

FIG. 2 shows an IR spectrum of an electron donating polymer according to Example 1;

FIG. 3 shows an ultraviolet-visible ray (UV-Vis) absorption spectrum of the electron donating polymer according to Example 1;

FIG. 4 shows ultraviolet-visible ray (UV-Vis) absorption spectra of the electron donating polymers according to Comparative Example 1 and Comparative Example 2.

Figure 1:
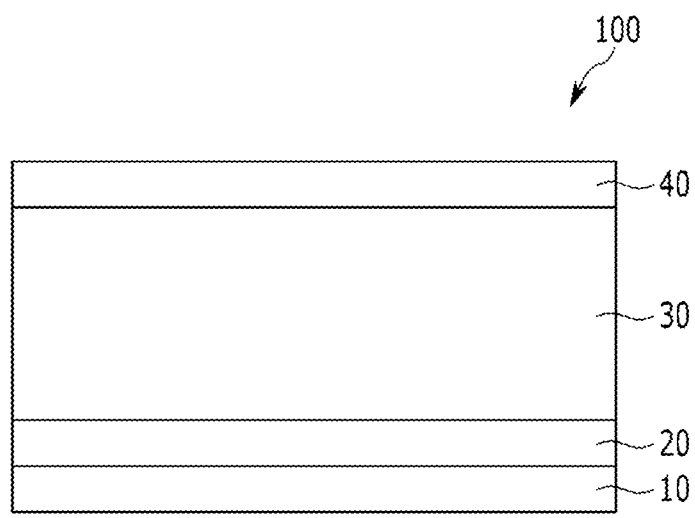
FIGS. 1-4 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features throughout the different views.

DETAILED DESCRIPTION

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, when a specific definition is not otherwise provided, the term "substituted" refers to one substituted with at least one substituent including a halogen (—F, —Cl, —Br, or —I), a hydroxy group, a nitro group, a cyano group, an amino group ($NH_2$, $NH(R^{200})$, or $N(R^{201})(R^{202})$ (wherein $R^{200}$, $R^{201}$, and $R^{202}$ are the same or different, and are each independently a C1 to C10 alkyl group), an amidino group, a hydrazine group, a hydrazone group, a carboxyl group, a substituted or unsubstituted alkyl group, a substituted or unsubstituted haloalkyl group, a substituted or unsubstituted alkoxy group, a substituted or unsubstituted alkenyl group, a substituted or unsubstituted alkynyl group, a substituted or unsubstituted aryl group, a substituted or unsubstituted heteroaryl group, or a substituted or unsubstituted heterocycloalkyl group in place of at least one hydrogen of a functional group.

As used herein, when a specific definition is not otherwise provided, the term "aliphatic" may refer to a C1 to C20 alkyl, a C2 to C20 alkenyl, a C2 to C20 alkynyl, a C1 to C20 alkylene, a C2 to C20 alkenylene, or a C2 to C20 alkynylene, and specifically a C1 to C15 alkyl, a C2 to C15 alkenyl, a C2 to C15 alkynyl, a C1 to C15 alkylene, a C2 to C15 alkenylene, or a C2 to C15 alkynylene, and more specifically a C1 to C10 alkyl, a C2 to C10 alkenyl, a C2 to C10 alkynyl, a C1 to C10 alkylene, a C2 to C10 alkenylene, or a C2 to C10 alkynylene, and the term "aromatic" may refer to a C6 to C30 aryl, a C2 to C30 heteroaryl, a C6 to C30 arylene, or a C2 to C30 heteroarylene, and specifically a C6 to C20 aryl, a C2 to C20 heteroaryl, a C6 to C20 arylene, or a C2 to C20 heteroarylene.

As used herein, when a specific definition is not otherwise provided, the terms "heterocycloalkyl group," "heteroaryl group," and "heteroarylene group" may independently refer to a cycloalkyl group, an aryl group, and an arylene group including at least one heteroatom of N, O, S, Si, or P and remaining carbon in one cycle.

As used herein, when a specific definition is not otherwise provided, the term "alkyl group" may refer to a C1 to C20 alkyl group, specifically a C1 to C15 alkyl group, and more specifically a C1 to C10 alkyl group, the term "cycloalkyl group" may refer to a C3 to C20 cycloalkyl group, specifically a C3 to C15 cycloalkyl group, and more specifically C3 to C10 cycloalkyl group, the term "alkylene group" may refer to a C1 to C20 alkylene group, specifically a C1 to C15 alkylene group, and more specifically a C1 to C10 alkylene group, the term "alkenyl group" may refer to a C2 to C20 alkenyl group, specifically a C2 to C15 alkenyl group, and more specifically C2 to C10 alkenyl group, the term "alkenylene group" may refer to a C2 to C20 alkenylene group, specifically a C2 to C15 alkenylene group, and more specifically C2 to C10 alkenylene group, the term "alkynyl group" may refer to a C2 to C20 alkynyl group, specifically a C2 to C15 alkynyl group, and more specifically C2 to C10 alkynyl group, the term "alkynylene group" may refer to a C2 to C20 alkynylene group, specifically a C2 to C15 alkynylene group, and more specifically C2 to C10 alkynylene group, the term "alkoxy group" may refer to a C1 to C20 alkoxy group, a C1 to C15 alkoxy group, and more specifically C1 to C10 alkoxy group, the term "aryl group" may refer to a C6 to C30 aryl group, specifically a C6 to C20 aryl group, and more specifically C6 to C15 aryl group, the term "heteroaryl group" may refer to a C2 to C30 heteroaryl group, specifically a C2 to C20 heteroaryl group, and more specifically a C2 to C15 heteroaryl group, the term "heteroarylene group" may refer to a C2 to C30 heteroarylene group, specifically a C2 to C20 heteroarylene group, and more specifically a C2 to C15 heteroarylene group, the term "heterocycloalkyl group" may refer to a C2 to C30 heterocycloalkyl group, specifically a C2 to C20 heterocycloalkyl group, and the term "halogen" may refer to F, Cl, Br, or I.

As used herein, when a definition is not otherwise provided, "combination" commonly refers to mixing or copolymerization. As used herein, when a definition is not otherwise provided, the term "copolymerization" may refer to block copolymerization, random copolymerization, graft copolymerization or alternating copolymerization, and the term "copolymer" may refer to a block copolymer, a random copolymer, a graft copolymer, or an alternating copolymer.

In addition, in the specification, the symbol "*" may refer to where something is connected with the same or different atom, or chemical formula.

Example embodiments are directed to an electron donating polymer and an organic solar cell including the same.

The electron donating polymer according to example embodiments include a repeating unit A represented by the following Chemical Formula 1 and a repeating unit B represented by the following Chemical Formula 2.

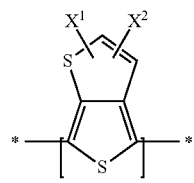

Chemical Formula 1

In Chemical Formula 1, $X^1$ is the same or different in each repeating unit, and is each independently an electron accepting group including two or more ester residual groups and a substituted or unsubstituted divalent aliphatic organic group linking the ester residual groups. $X^2$ is the same or different in each repeating unit, and is each independently hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, or —$SR^{100}$. Herein, $R^{100}$ is a substituted or unsubstituted C1 to C20 aliphatic organic group, a substituted or unsubstituted C2 to C30 aromatic organic group, or a substituted or unsubstituted C2 to C30 heterocycloalkyl group (e.g., a substituted or unsubstituted C1 to C20 alkyl group).

When $X^1$ and $X^2$ include an alkenyl group or an alkynyl group, $X^1$ and $X^2$ may include one or two carbon-carbon unsaturated bonds (e.g., a carbon-carbon double bond and a carbon-carbon triple bond).

For example, the repeating unit A represented by Chemical Formula 1 may include one selected from a repeating unit represented by the following Chemical Formula 1-1, a repeating unit represented by the following Chemical Formula 1-2, and a combination thereof.

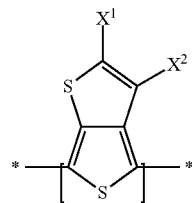

Chemical Formula 1-1

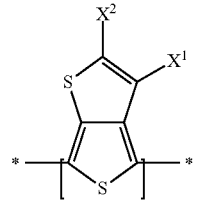

Chemical Formula 1-2

In Chemical Formulas 1-1 and 1-2, $X^1$ and $X^2$ are the same as in Chemical Formula 1.

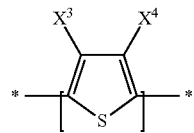

Chemical Formula 2

In Chemical Formula 2, $X^3$ and $X^4$ are the same or different, and are each independently hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, or —$SR^{101}$. Herein, $R^{101}$ is a substituted or unsubstituted C1 to C20 aliphatic organic group, a substituted or unsubstituted C2 to C30 aromatic organic group, or a substituted or unsubstituted C2 to C30 heterocycloalkyl group (e.g., a substituted or unsubstituted C1 to C20 alkyl group).

In example embodiments, $X^3$ and $X^4$ are the same or different, and are each independently hydrogen, halogen, a substituted or unsubstituted C1 to C15 alkyl group, a substituted or unsubstituted C1 to C15 alkoxy group, or —$SR^{102}$, wherein $R^{102}$ is a substituted or unsubstituted C1 to C15 alkyl group.

When $X^3$ and $X^4$ include an alkenyl group or an alkynyl group, $X^3$ and $X^4$ may include one or two carbon-carbon unsaturated bonds (e.g., a carbon-carbon double bond and a carbon-carbon triple bond).

The electron donating polymer may play a role in providing electrons to the outside by including the repeating unit B represented by Chemical Formula 2.

The electron donating polymer is a functional group which is capable of functioning as a compatibilizer and includes the repeating unit A represented by Chemical Formula 1. The repeating unit A represented by Chemical Formula 1 includes an electron accepting group including at least two ester residual groups, and a substituted or unsubstituted divalent aliphatic organic group linking the ester residual groups. Thereby, the electron donating polymer may improve miscibility with the electron acceptor so as to more effectively improve the morphology of a photoactive layer. As a result, it may easily separate electrons and holes and prevent the recombination of electrons and holes, so it may improve the photoelectric conversion efficiency of an organic solar cell when it is used for the organic solar cell.

In the electron donating polymer, the substituted or unsubstituted divalent aliphatic organic group included in the repeating unit A represented by Chemical Formula 1 may be hydrophobic; in other example embodiments, the ester residual group may be hydrophilic or polar. Thereby, the electron donating polymer may be more effectively dissolved in various solvents, so it may easily provide a photoactive layer.

In addition, in the electron donating polymer, because the repeating unit A represented by Chemical Formula 1 includes the electron accepting group, it may have a lower LUMO (lowest unoccupied molecular orbital) level and may also have a similar HOMO (highest occupied molecular orbital) level compared to a polymer including no electron accepting group. Resultantly, the electron donating polymer has a smaller bandgap than the polymer including no electron accepting group and may absorb solar light having a wider wavelength region.

The electron accepting group including at least two ester residual groups and a substituted or unsubstituted divalent aliphatic organic group linking the ester residual groups may include a functional group represented by the following Chemical Formula 3 or 4, without limitation.

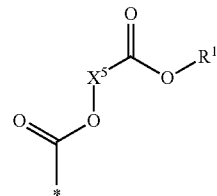

Chemical Formula 3

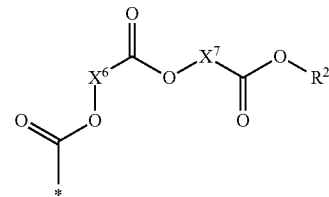

Chemical Formula 4

In Chemical Formulas 3 and 4, $X^5$ to $X^7$ are the same or different, and are each independently a substituted or unsubstituted divalent C1 to C20 aliphatic organic group, specifically a substituted or unsubstituted divalent C1 to C10 aliphatic organic group, and more specifically a substituted or unsubstituted divalent C1 to C10 alkylene group. $R^1$ and $R^2$ are the same or different, and are each independently hydrogen, or substituted or unsubstituted C1 to C20 aliphatic organic group, specifically hydrogen, or a substituted or unsubstituted C1 to C10 aliphatic organic group, more specifically hydrogen, or a substituted or unsubstituted C1 to C10 alkyl group. $R^1$ and $R^2$ may be hydrogen, or a substituted or unsubstituted C1 to C6 alkyl group.

For example, the repeating unit A including the functional group represented by Chemical Formula 3 or 4 may be synthesized in accordance with Reaction Scheme 1 or 2 without limitation.

Reaction Scheme 1

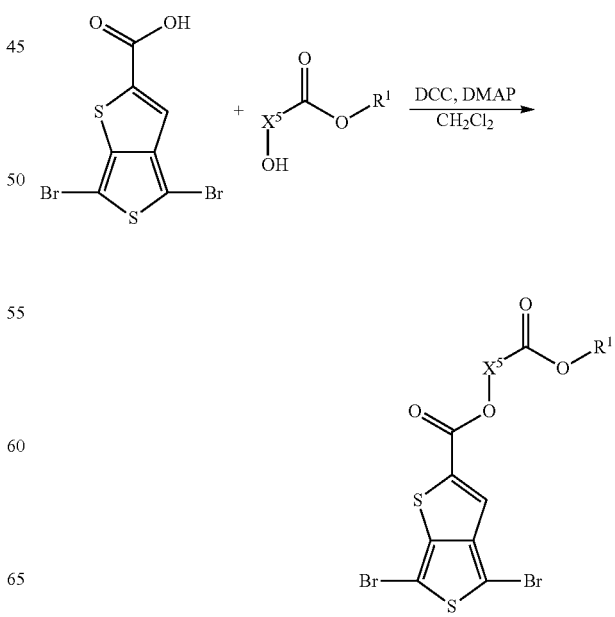

-continued
Reaction Scheme 2

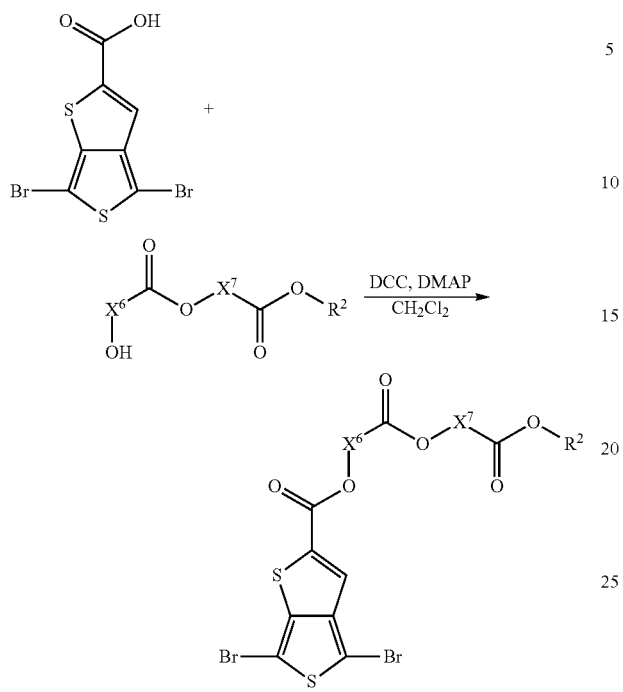

In Reaction Schemes 1 and 2, $X^5$ to $X^7$, $R^1$ and $R^2$ are the same as described in Chemical Formulas 3 and 4.

In example embodiments, the repeating unit A including the functional group represented by Chemical Formula 3 or 4 may be obtained by dissolving 4,6-dibromothieno[3,4-b]thiophene-2-carboxylic acid, dicyclohexylcarbodiimide (DCC), and 4-dimethylaminopyridine (DMAP) in dichloromethane (MC), and reacting the resultant with an alkyl hydroxyalkanoate derivative represented by the following Chemical Formula 3-1 or the following Chemical Formula 4-1.

Chemical Formula 3-1

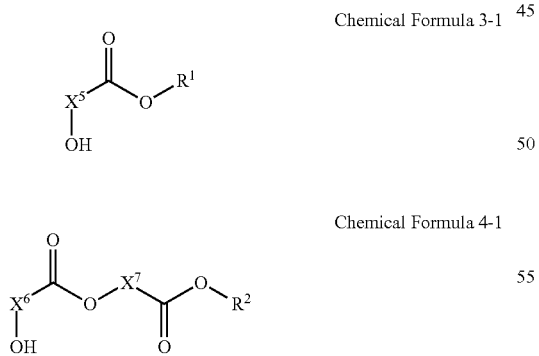

Chemical Formula 4-1

In Chemical Formula 3-1 and 4-1, $X^5$ to $X^7$, $R^1$ and $R^2$ are the same as described in Chemical Formulas 3 and 4.

In example embodiments, the repeating unit A may include a repeating unit represented by the following Chemical Formula 5-1, a repeating unit represented by the following Chemical Formula 5-2, or a combination thereof, without limitation.

Chemical Formula 5-1

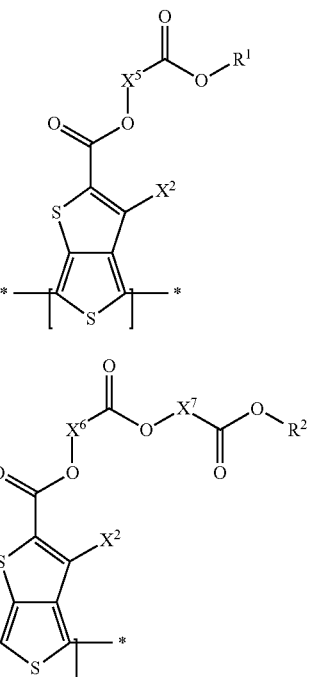

Chemical Formula 5-2

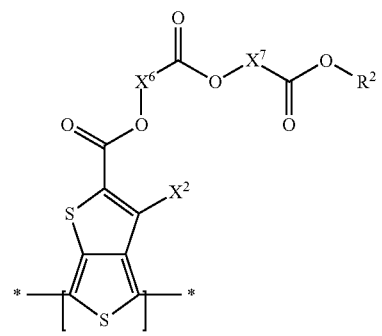

In Chemical Formulas 5-1 and 5-2, $X^2$ is the same or different in each repeating unit, and is independently hydrogen, a halogen, or a substituted or unsubstituted C1 to C20 alkyl group, $X^5$ to $X^7$ are the same or different and are each independently a substituted or unsubstituted divalent C1 to C10 aliphatic organic group, and $R^1$ and $R^2$ are the same or different and are each independently hydrogen, or a substituted or unsubstituted C1 to C10 aliphatic organic group.

In example embodiments, the repeating unit A may include a repeating unit represented by the following Chemical Formula 6-1, a repeating unit represented by the following Chemical Formula 6-2, or a combination thereof, without limitation.

Chemical Formula 6-1

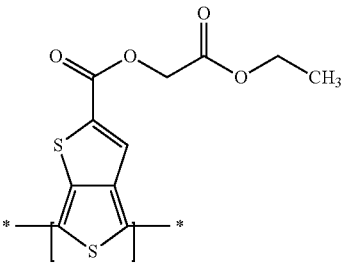

Chemical Formula 6-2

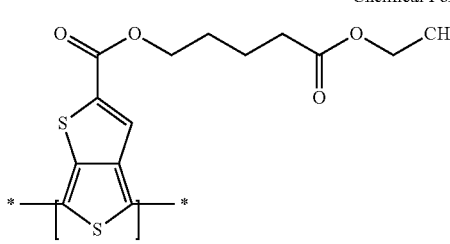

In example embodiments, the repeating unit B may include one selected from repeating units represented by the following Chemical Formulas 7-1 to 7-4, and a combination thereof, without limitation.

Chemical Formula 7-1

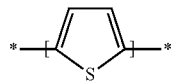

Chemical Formula 7-2

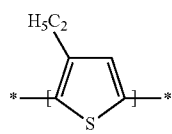

Chemical Formula 7-3

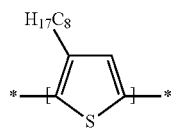

Chemical Formula 7-4

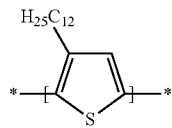

The electron donating polymer may include the repeating unit A and the repeating unit B in a mole ratio of about 1:0.5 to about 1:2.5. When the repeating unit A and the repeating unit B have the mole ratio within the above range, it may increase the number average molecular Weight (Mn) of the electron donating polymer, effectively control the number average molecular weight (Mn) of the electron donating polymer, and easily provide the electron donating polymer according to a solution process. Specifically, the repeating unit A and the repeating unit B may be included in a mole ratio of about 1:0.75 to about 1:2.5, and more specifically about 1:1 to about 1:2.

The electron donating polymer may include one selected from repeating units represented by the following Chemical Formulas 8-1 to 8-4, and a combination thereof, without limitation.

Chemical Formula 8-1

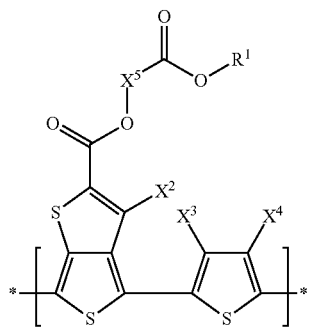

Chemical Formula 8-2

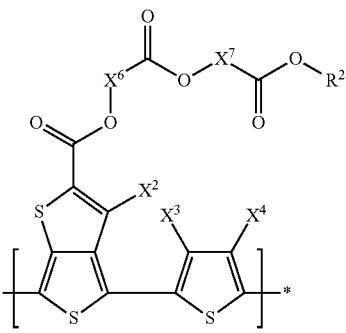

Chemical Formula 8-3

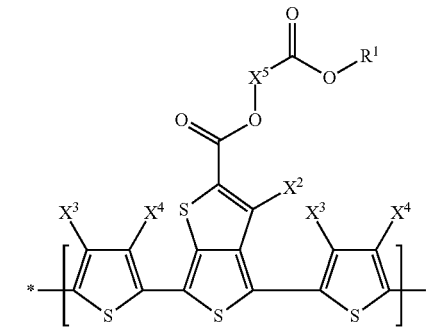

Chemical Formula 8-4

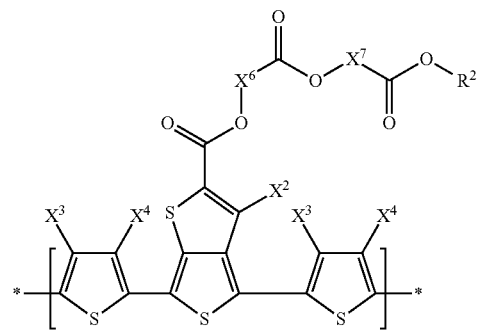

In Chemical Formulas 8-1 to 8-4, $X^2$ is the same or different in each repeating unit, and is independently hydrogen, a halogen, or a substituted or unsubstituted C1 to C20 alkyl group. $X^3$ and $X^4$ are the same or different, and are each independently hydrogen, halogen, a substituted or unsubstituted C1 to C15 alkyl group, a substituted or unsubstituted C1 to C15 alkoxy group, or —$SR^{102}$, wherein $R^{102}$ is a substituted or unsubstituted C1 to C15 alkyl group. $X^5$ to $X^7$ are the same or different, and are each independently a substituted or unsubstituted divalent C1 to C10 aliphatic organic group, and $R^1$ and $R^2$ are the same or different, and are each independently hydrogen, or a substituted or unsubstituted C1 to C10 aliphatic organic group.

In example embodiments, the electron donating polymer may include one selected from repeating units represented by the following Chemical Formulas 9-1 and 9-2, and a combination thereof, without limitation.

Chemical Formula 9-1

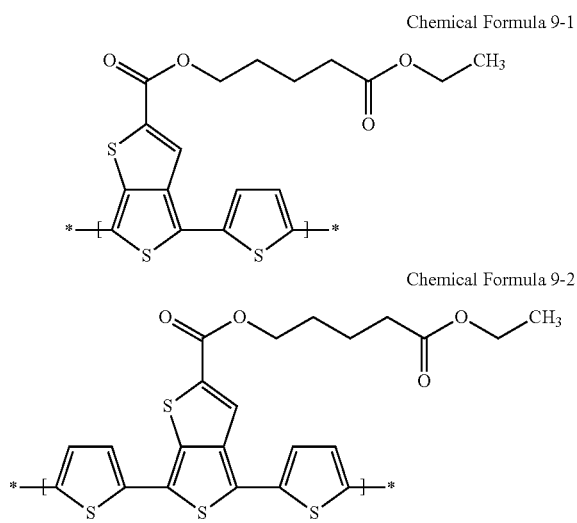

Chemical Formula 9-2

The electron donating polymer may have a number average molecular weight (Mn) of about 500 g/mol to about 800,000 g/mol. When the electron donating polymer has the number average molecular weight (Mn) within the above range, it may easily control the solution composition when preparing the electron donating polymer, so it may effectively control the properties of the electron donating polymer. In addition, it may easily process the electron donating polymer to facilitate the same to provide the organic solar cell. The electron donating polymer may have a number average molecular weight (Mn) ranging from about 700 g/mol to about 500,000 g/mol, specifically, about 1,000 g/mol to about 200,000 g/mol, more specifically, about 2,000 g/mol to about 100,000 g/mol, and even more specifically, about 5,000 g/mol to about 50,000 g/mol.

The electron donating polymer may have a bandgap of about 1.2 eV to about 2.5 eV. When the electron donating polymer has the bandgap within the above range, it may effectively absorb the solar light in the wide wavelength region, so it may enhance the short circuit current density (Jsc) to more effectively improve the efficiency of an organic solar cell using the same. The electron donating polymer may have a bandgap ranging from about 1.3 eV to about 1.6 eV and specifically, from about 1.35 eV to about 1.6 eV.

Hereinafter, an organic solar cell according to example embodiments will be described.

FIG. 1 is a cross-sectional view of an organic solar cell according to example embodiments.

Referring to FIG. 1, an organic solar cell 100 may include a substrate 10, a lower electrode 20 on a surface of the substrate 10, a photoactive layer 30 on a surface of the lower electrode 20, and an upper electrode 40 on a surface of the photoactive layer 30.

The substrate 10 may be made of a transparent material. The transparent material may be, for example, an inorganic material (e.g., glass), or an organic material (e.g., polycarbonate, polymethylmethacrylate, polyethylene terephthalate, polyethylene naphthalate, polyamide, and/or polyethersulfone).

Either of the lower electrode 20 and the upper electrode 40 is an anode, while the other is a cathode. Either of the lower electrode 20 and the upper electrode 40 may be made of a transparent conductor (e.g., indium tin oxide (ITO), indium-doped zinc oxide (IZO), tin oxide ($SnO_2$), aluminum-doped zinc oxide (AZO), gallium-doped zinc oxide (GZO), and the like), while the other is made of an opaque conductor (e.g., aluminum (Al), silver (Ag), gold (Au), lithium (Li), and the like).

The photoactive layer 30 may include an electron acceptor made of an n-type semiconductor material and an electron donor made of a p-type semiconductor material.

The electron acceptor may include, for example, a fullerene with a large electron affinity (e.g., C60, C70, C74, C76, C78, C82, C84, C720, C860, and the like), fullerene derivatives (e.g., 1-(3-methoxy-carbonyl)propyl-1-phenyl(6,6)C61 (PCBM), C71-PCBM, C84-PCBM, bis-PCBM, and the like), perylene, an inorganic semiconductor (e.g., CdS, CdTe, CdSe, ZnO, and the like), or a combination thereof.

The electron donor includes the aforementioned electron donating polymer. By including the electron donating polymer, the organic solar cell may have a higher short circuit current density (Jsc) compared to the conventional organic solar cell while maintaining a similar open circuit voltage (Voc) to the conventional organic solar cell. In addition, the electron donor may be effectively dissolved in various solvents and be effectively miscible with the electron acceptor. Thereby, the organic solar cell may have excellent photoelectric conversion efficiency.

The electron acceptor and the electron donor may have, for example, a bulk heterojunction structure. The bulk heterojunction structure generates a photocurrent by diffusing a pair of electron-holes excited by light absorbed in the photoactive layer 30 into an interface between the electron acceptor and the electron donor, separating the pair of electron-holes into electrons and holes due to an electronic affinity difference of two materials on the interface, and moving the electrons through the electron acceptor to the cathode and the holes through the electron donor to the anode.

Hereinafter, example embodiments are illustrated in more detail with reference to examples. However, these are example embodiments and are not limiting.

EXAMPLES

Example 1

Preparation of Electron Donating Polymer

A derivative of a repeating unit A, 5-ethoxy-5-oxopentyl-4,6-dibromothieno[3,4-b]thiophene-2-carboxylate is synthesized according to the following Reaction Scheme 3.

Reaction Scheme 3

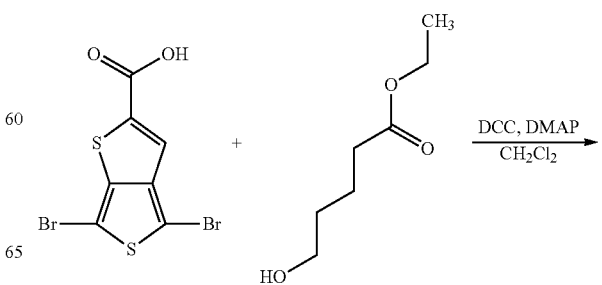

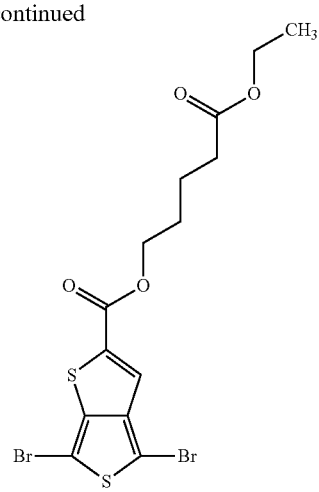

About 1.00 g (about 2.92 mmol) of 4,6-dibromothieno[3,4-b]thiophene-2-carboxylic acid, about 0.731 g (about 3.51 mmol) of dicyclohexylcarbodiimide (DCC), and about 0.123 g (about 1.01 mmol) of 4-dimethylaminopyridine (DMAP) are dissolved in about 10 ml of dichloromethane (MC) under nitrogen atmosphere, and about 2.19 g (about 15.0 mmol) of ethyl-5-hydroxypentanoate is added thereto. The mixture is agitated for about 20 hours at room temperature. Next, about 50 ml of water is poured to the agitated mixture, and the resulting mixture is extracted with dichloromethane. After the extraction, a small amount of water in an organic layer is removed with sodium sulfate, and a solvent therein is removed. The resulting product is purified through a column chromatography using silica gel, obtaining 5-ethoxy-5-oxo-pentyl-4,6-dibromothieno[3,4-b]thiophene-2-carboxylate.

Then, an electron-donating polymer is prepared according to the following Reaction Scheme 4.

Reaction Scheme 4

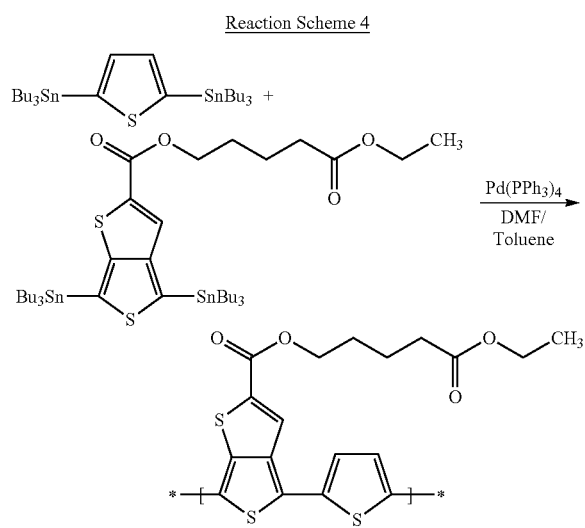

About 331 mg (about 0.500 mmol) of bis(tributyltin)thiophene and about 235 mg (about 0.500 mmol) of 5-ethoxy-5-oxopentyl-4,6-dibromothieno[3,4-b]thiophene-2-carboxylate are put in 10 ml of dimethylforamide (DMF)/toluene mixed in a volume ratio of 1/4, and about 25 mg (about 0.022 mmol) of Pd(PPh$_3$)$_4$ as a catalyst is added thereto. The mixture is agitated. The agitated mixture is heated at about 120° C., preparing an electron-donating polymer. The electron donating polymer has a number average molecular weight (Mn) of about 700 g/mol and a weight average molecular weight (Mw) of about 760 g/mol.

Example 2

Preparation of Electron-Donating Polymer 5-ethoxy-5-oxopentyl-4,6-dibromothieno[3,4-b]thiophene-2-carboxylate is prepared according to the same method as Example 1.

Next, an electron donating polymer is prepared according to the following Reaction Scheme 5.

Reaction Scheme 5

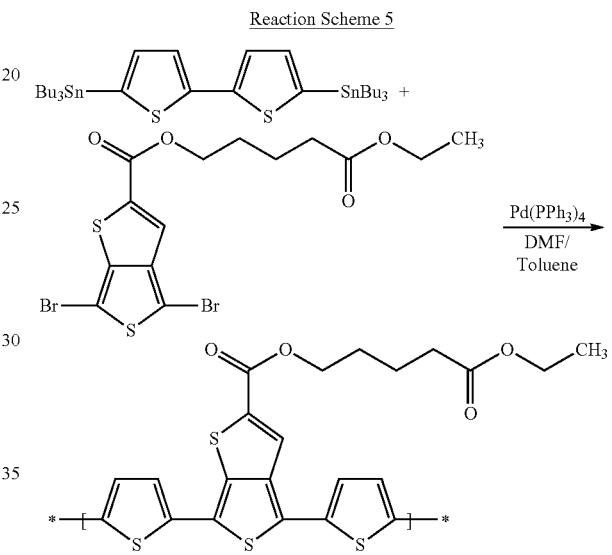

About 372 mg (about 0.500 mmol) of bi-2,2"-tributyltin-thiophene and about 235 mg (about 0.500 mmol) of 5-ethoxy-5-oxopentyl-4,6-dibromothieno[3,4-b]thiophene-2-carboxylate are put in about 10 ml of DMF (dimethylforamide)/toluene mixed in a volume ratio=1/4, and about 25 mg (about 0.022 mmol) of Pd(PPh$_3$)$_4$ as a catalyst is added thereto. The mixture is agitated. The agitated mixture is heated at about 120° C., preparing an electron-donating polymer. The electron-donating polymer has a number average molecular weight (Mn) of about 1000 g/mol and a weight average molecular weight (Mw) of about 1085 g/mol.

Example 3

Fabrication of Solar Cell

An about 1 mm-thick transparent glass substrate is prepared.

Then, an about 150 nm-thick indium tin oxide (ITO) anode is provided on the transparent glass substrate using a sputtering method.

A PEDOT:PSS (poly(3,4-ethylenedioxythoiphene): poly(styrenesulfonate) layer having a thickness of about 30 nm is provided on the ITO anode using a spin coating method and baked for one hour. For the spin coating, SPIN-1200D (manufactured by MIDAS SYSTEM) is used.

About 8 mg of the electron donating polymer obtained from Example 1 and about 12 mg of C71-PCBM are introduced into about 0.97 ml of chlorobenzene and added with about 0.03 ml of diiodooctane and agitated for about 14 hours to provide a mixture. The mixture is coated on the PEDOT: PSS layer using a spin coating method (at about 2000 rpm) in a thickness of about 65 nm to provide a photoactive layer. For the spin coating, SPIN-1200D (manufactured by MIDAS SYSTEM) is used.

A Ca/Al cathode is provided on the photoactive layer in a thickness of about 20/80 nm using thermal evaporation. For the thermal deposition, GVtech equipment is used.

Thereby, a solar cell is provided.

Example 4

Fabrication of Solar Cell

A solar cell is fabricated according to the same method as Example 3 except for adding about 8 mg of the electron donating polymer according to Example 2 and about 12 mg of C71-PCBM are added to about 0.97 ml of chlorobenzene and adding about 0.03 ml of diiodooctane thereto, agitating the mixture for about 14 hours, and forming an about 64 nm-thick photoactive layer on the PEDOT:PSS layer by spin-coating (at about 1500 rpm) the agitated mixture.

Comparative Example 1

Preparation of Electron-Donating Polymer

A polymer including a repeating unit represented by the following Chemical Formula 10 is used as an electron donating polymer. The electron donating polymer has a number average molecular weight (Mn) of about 21000 g/mol.

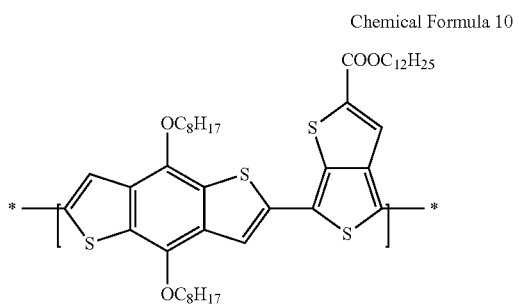

Chemical Formula 10

Comparative Example 2

Preparation of Electron-Donating Polymer

A polymer including a repeating unit represented by the following Chemical Formula 11 is used as an electron donating polymer. The electron donating polymer has a number average molecular weight (Mn) of about 21000 g/mol.

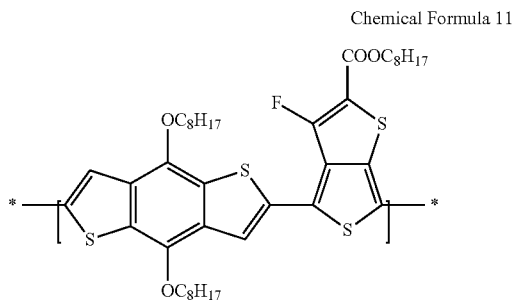

Chemical Formula 11

Comparative Example 3

Fabrication of Solar Cell

A solar cell is fabricated according to the same method as Example 3 except for putting about 12 mg of the electron donating polymer according to Comparative Example 1 and about 12 mg of C71-PCBM in about 0.97 ml of chlorobenzene and adding about 0.03 ml of diiodooctane, agitating the mixture for about 14 hours, and forming an about 68 nm-thick photoactive layer on the PEDOT:PSS layer by spin-coating (at about 1500 rpm) the agitated mixture.

Comparative Example 4

Fabrication of Solar Cell

A solar cell is fabricated according to the same method as Example 3 except for putting about 10 mg of the electron donating polymer according to Comparative Example 2 and 15 mg of C71-PCBM in 0.97 ml of chlorobenzene and adding 0.03 ml of diiodooctane thereto, agitating the mixture for about 14 hours, and forming an about 65 nm-thick photoactive layer on the PEDOT:PSS layer by spin-coating (about 1500 rpm) the agitated mixture.

Experimental Example 1

IR Measurement

Figure 2:
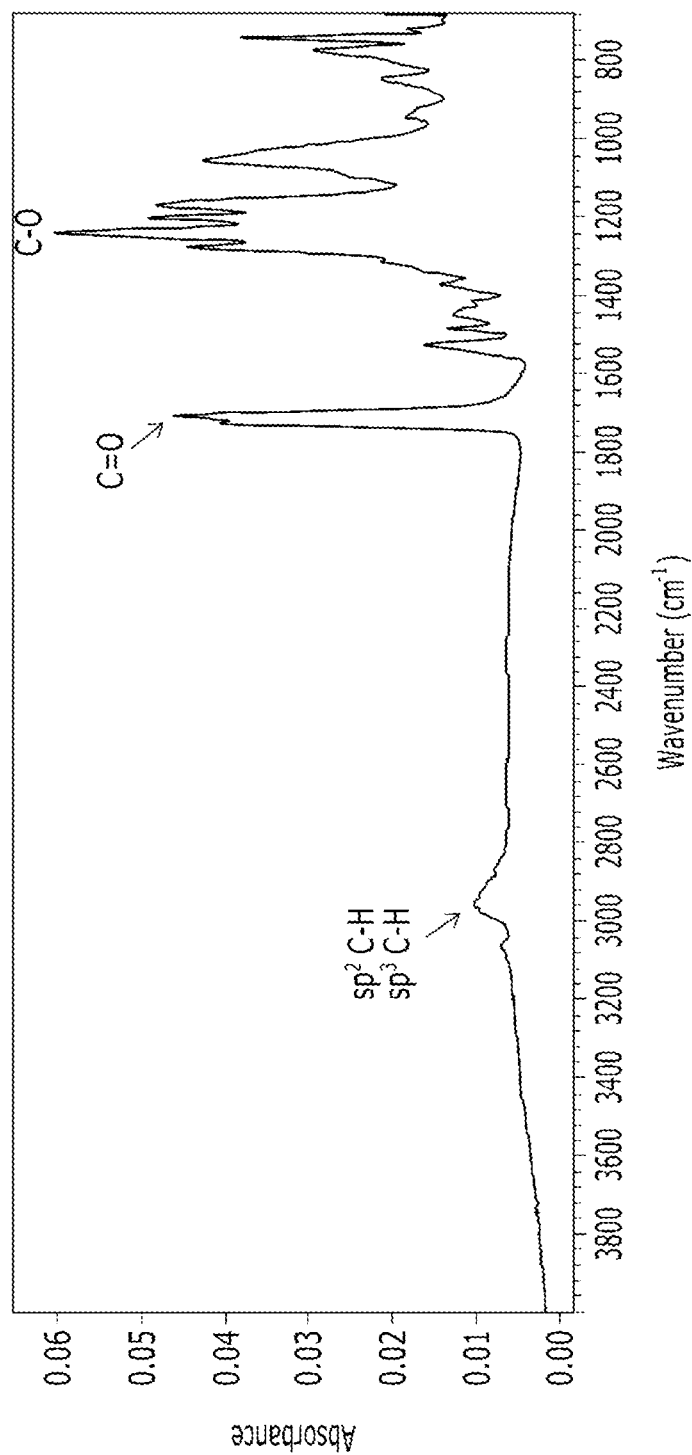

A Bio Rad FTS 6000 FTIR spectrometer is used to measure IR spectra of the electron donating polymers according to Examples 1 and 2 in an ATR method. FIG. 2 shows the IR spectrum of the electron donating polymer according to Example 1.

As shown in FIG. 2, the electron donating polymer according to Example 1 has an about 2960 cm-1 peak showing a sp2 C—H bond and a sp3 C—H bond, about 1714 cm-1 peak showing a C=O bond, and about 1250 $cm^{-1}$, about 1180 $cm^{-1}$, and about 1050 $cm^{-1}$ peaks showing a C—O bond and thus, is identified to be a resulting material according to the Reaction Scheme 4.

Experimental Example 2

Light Absorption Characteristic Evaluation and Bandgap Measurement

The electron donating polymers according to Examples 1 and 2 and Comparative Examples 1 and 2 are respectively dissolved in dichlorobenzene, and the solution is dropped on a glass substrate. The solution on the glass substrate is dried to remove a solvent, obtaining a film. Then, a Cary 5000 UV spectroscopy equipment made by Varian Inc. is used to measure ultraviolet (UV)-visible ray absorption spectrum of each film.

Figure 3:
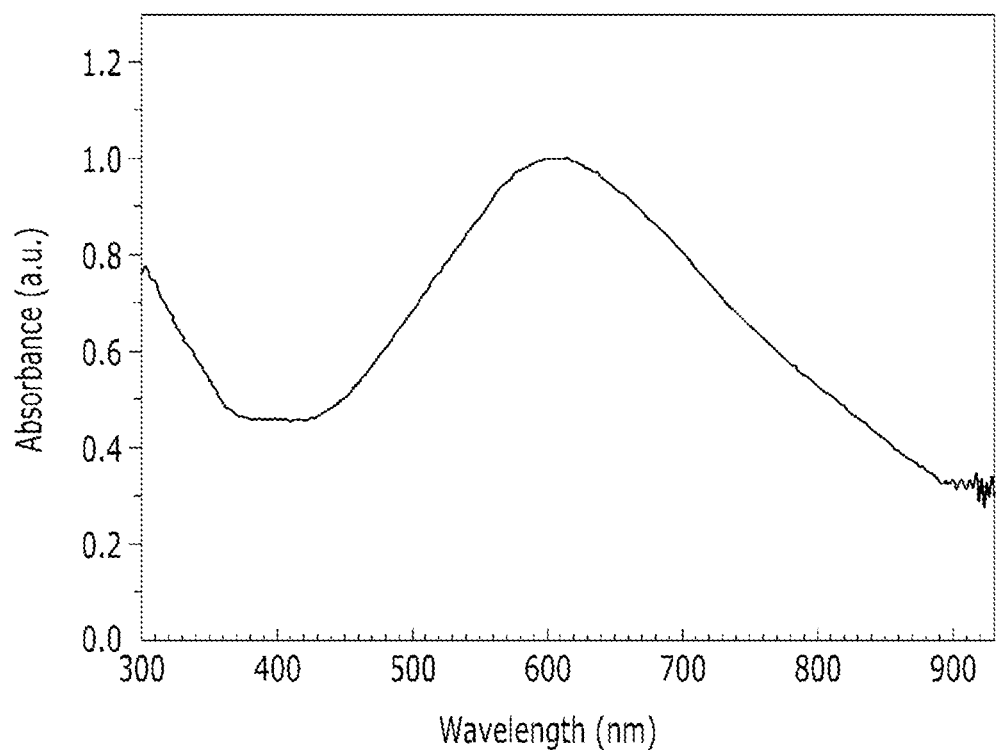
Figure 4:
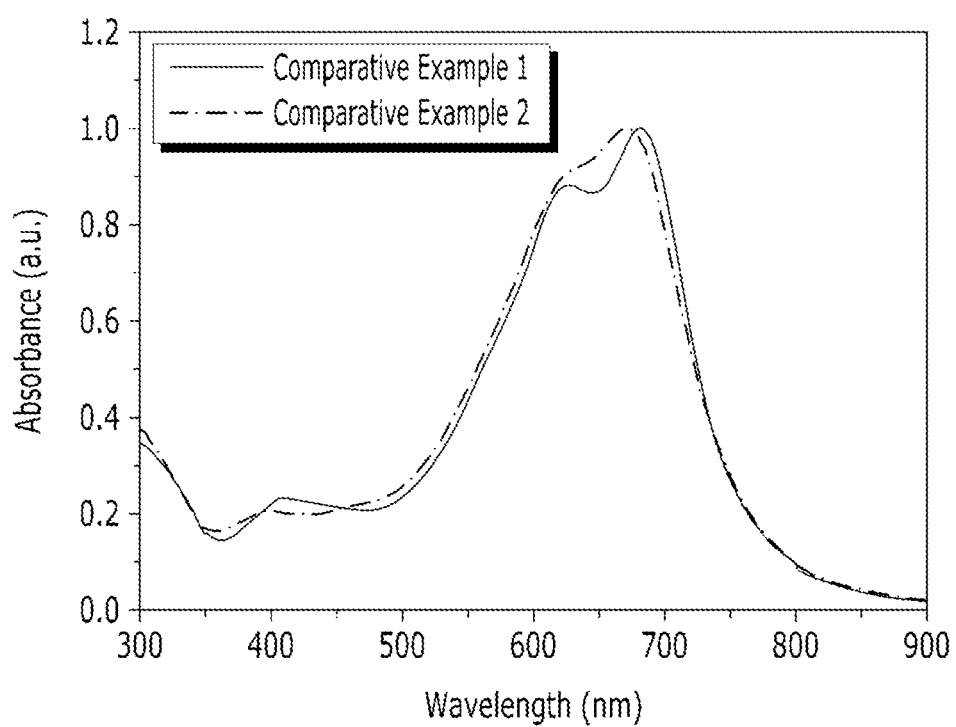

FIG. 3 provides ultraviolet-visible (UV-Vis) ray absorption spectrum of the electron donating polymer according to Example 1, and FIG. 4 provides ultraviolet-visible (UV-Vis) ray absorption spectra of the electron donating polymers according to Comparative Examples 1 and 2.

In addition, an absorption edge is measured from the ultraviolet-visible (UV-Vis) ray absorption spectrum, and an optical bandgap is measured from the absorption edge. The result is provided in the following Table 1.

TABLE 1

|  | ABSORPTION EDGE (NM) | OPTICAL BANDGAP (EV) |
|---|---|---|
| EXAMPLE 1 | 890 | 1.39 |
| EXAMPLE 2 | 805 | 1.54 |
| COMPARATIVE EXAMPLE 1 | 765 | 1.62 |
| COMPARATIVE EXAMPLE 2 | 752 | 1.65 |

As shown in FIG. 3, the electron donating polymer according to Example 1 is identified to sufficiently absorb a light in a wavelength region ranging from about 300 nm to about 900 nm.

As shown in FIG. 4, the electron donating polymers according to Comparative Examples 1 and 2 are identified to mainly absorb a light in a wavelength region ranging from about 500 nm to about 700 nm.

In addition, as shown in Table 1, the electron donating polymers according to Example 1 and 2 have a smaller optical bandgap than the electron donating polymers according to Comparative Examples 1 and 2. The reason is that an electron accepting group including at least two ester residual groups included in the electron donating polymer according to Examples 1 and 2, and a substituted or unsubstituted divalent aliphatic organic group linking the ester residual groups lowers a LUMO level and decreases a bandgap.

While the above subject matter has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A polymer, comprising:
a repeating unit A represented by the following Chemical Formula 1; and
a repeating unit B represented by the following Chemical Formula 2:

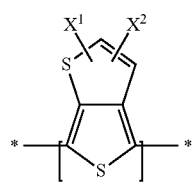

Chemical Formula 1 wherein, in Chemical Formula 1,
$X^1$ is the same or different in each repeating unit, and is independently a group including at least two ester residual groups and a substituted or unsubstituted divalent aliphatic organic group linking the at least two ester residual groups, and
$X^2$ is the same or different in each repeating unit, and is independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and $-SR^{100}$, wherein $R^{100}$ is one selected from a substituted or unsubstituted C1 to C20 aliphatic organic group, a substituted or unsubstituted C2 to C30 aromatic organic group, and a substituted or unsubstituted C2 to C30 heterocycloalkyl group,

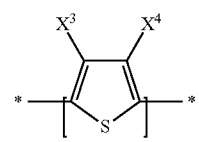

Chemical Formula 2 wherein, in Chemical Formula 2,
$X^3$ and $X^4$ are the same or different, and are each independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and $-SR^{101}$, wherein $R^{101}$ is a substituted or unsubstituted C1 to C20 aliphatic organic group, a substituted or unsubstituted C2 to C30 aromatic organic group, and a substituted or unsubstituted C2 to C30 heterocycloalkyl group
wherein the group including the at least two ester residual groups and the substituted or unsubstituted divalent aliphatic organic group linking the at least two ester residual groups is a functional group represented by the following Chemical Formula 3 or 4:

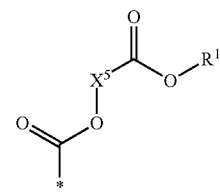

Chemical Formula 3

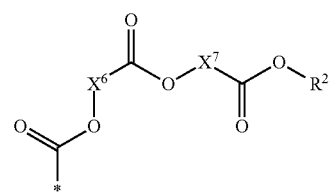

Chemical Formula 4 wherein, in Chemical Formulas 3 and 4,
$X^5$ to $X^7$ are the same or different, and are each independently a substituted or unsubstituted divalent C1 to C20 aliphatic organic group, and
$R^1$ and $R^2$ are the same or different, and are each independently one selected from hydrogen, and a substituted or unsubstituted C1 to C20 aliphatic organic group.

2. A polymer, comprising:
a repeating unit A represented by the following Chemical Formula 1; and
a repeating unit B represented by the following Chemical Formula 2:

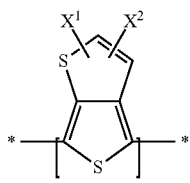

Chemical Formula 1 wherein, in Chemical Formula 1,
$X^1$ is the same or different in each repeating unit, and is independently a group including at least two ester residual groups and a substituted or unsubstituted divalent aliphatic organic group linking the at least two ester residual groups, and
$X^2$ is the same or different in each repeating unit, and is independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and —$SR^{100}$, wherein $R^{100}$ is one selected from a substituted or unsubstituted C1 to C20 aliphatic organic group, a substituted or unsubstituted C2 to C30 aromatic organic group, and a substituted or unsubstituted C2 to C30 heterocycloalkyl group,

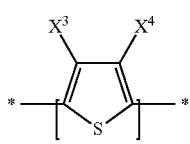

Chemical Formula 2 wherein, in Chemical Formula 2,
$X^3$ and $X^4$ are the same or different, and are each independently one selected from hydrogen, a halogen, a substituted or unsubstituted C1 to C20 aliphatic organic group, a hydroxyl group, a substituted or unsubstituted C1 to C20 alkoxy group, a substituted or unsubstituted C1 to C20 ester group, a thiol group, and —$SR^{101}$, wherein $R^{101}$ is a substituted or unsubstituted C1 to C20 aliphatic organic group, a substituted or unsubstituted C2 to C30 aromatic organic group, and a substituted or unsubstituted C2 to C30 heterocycloalkyl group,
wherein the repeating unit A includes one selected from a repeating unit represented by the following Chemical Formula 5-1, a repeating unit represented by the following Chemical Formula 5-2, and a combination thereof:

Chemical Formula 5-1

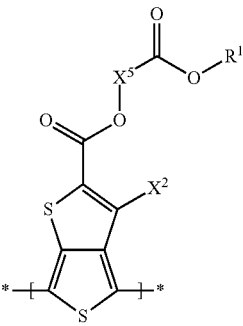

Chemical Formula 5-2 wherein, in Chemical Formulas 5-1 and 5-2,
$X^2$ is the same or different in each repeating unit, and is independently one selected from hydrogen, a halogen, and a substituted or unsubstituted C1 to C20 alkyl group,
$X^5$ to $X^7$ are the same or different, and are each independently a substituted or unsubstituted divalent C1 to C10 aliphatic organic group, and
$R^1$ and $R^2$ are the same or different, and are each independently one selected from hydrogen, and a substituted or unsubstituted C1 to C10 aliphatic organic group, and
wherein, in Chemical Formula 2,
$X^3$ and $X^4$ are the same or different, and are each independently one selected from hydrogen, a halogen, a substituted or unsubstituted C1 to C15 alkyl group, a substituted or unsubstituted C1 to C15 alkoxy group, and —$SR^{102}$, wherein $R^{102}$ is a substituted or unsubstituted C1 to C15 alkyl group.

3. The polymer of claim 1, wherein the repeating unit A includes one selected from a repeating unit represented by the following Chemical Formula 6-1, a repeating unit represented by the following Chemical Formula 6-2, and a combination thereof, and
the repeating unit B includes one selected from repeating units represented by the following Chemical Formulas 7-1 to 7-4, and a combination thereof:

Chemical Formula 6-1

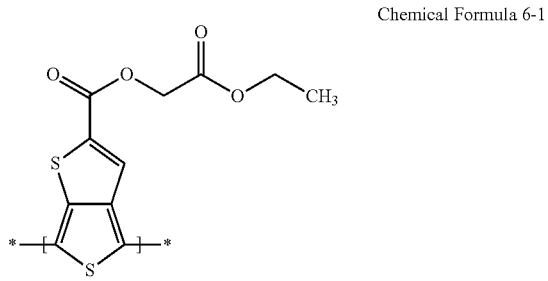

Chemical Formula 6-2

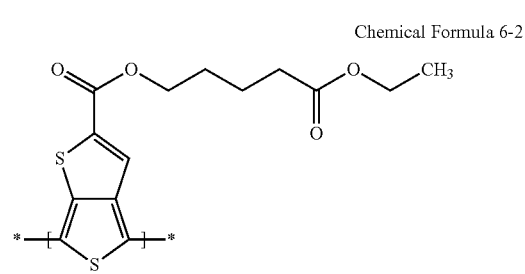

Chemical Formula 7-1

Chemical Formula 7-2

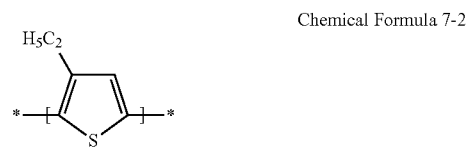

Chemical Formula 7-3

Chemical Formula 7-4

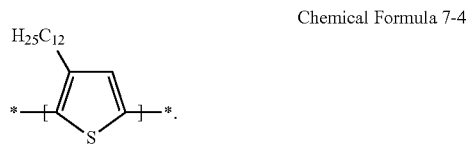

Chemical Formula 8-1

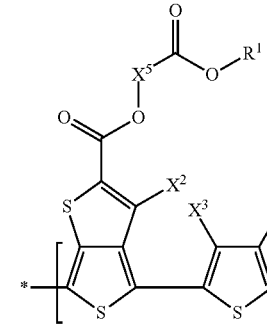

Chemcial Formula 8-2

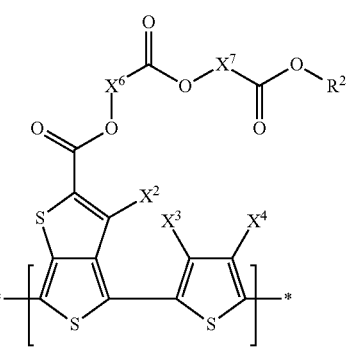

Chemical Formula 8-3

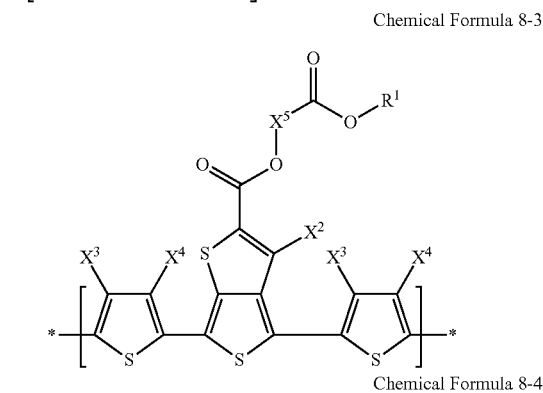

Chemical Formula 8-4

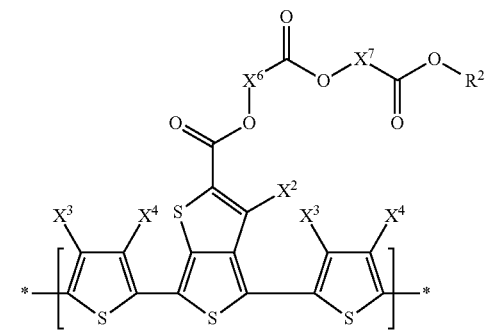

4. The polymer of claim 1, wherein the repeating units A and B are in a mole ratio of about 1:0.5 to about 1:2.5.

5. The polymer of claim 1, wherein the repeating units A and B are in a mole ratio of about 1:1 to about 1:2.

6. The polymer of claim 1, wherein the repeating unit A and the repeating unit B collectively form a repeating unit C, and the repeating unit C is one selected from repeating units represented by the following Chemical Formulas 8-1 to 8-4, and a combination thereof:

wherein, in Chemical Formulas 8-1 to 8-4, $X^2$ is the same or different in each repeating unit, and is independently one selected from hydrogen, a halogen, and a substituted or unsubstituted C1 to C20 alkyl group, $X^3$ and $X^4$ are the same or different, and are each independently one selected from hydrogen, a halogen, a substituted or unsubstituted C1 to C15 alkyl group, a substituted or unsubstituted C1 to C15 alkoxy group, and —$SR^{102}$, wherein $R^{102}$ is a substituted or unsubstituted C1 to C15 alkyl group, $X^5$ to $X^7$ are the same or different, and are each independently a substituted or unsubstituted divalent C1 to C10 aliphatic organic group, and $R^1$ and $R^2$ are the same or different, and are each independently one selected from hydrogen, and a substituted or unsubstituted C1 to C10 aliphatic organic group.

7. The polymer of claim 1, wherein the repeating unit A and the repeating unit B collectively form a repeating unit C, and the repeating unit C is one selected from a repeating unit represented by the following Chemical Formula 9-1, a repeating unit represented by the following Chemical Formula 9-2, and a combination thereof:

Chemical Formula 9-1

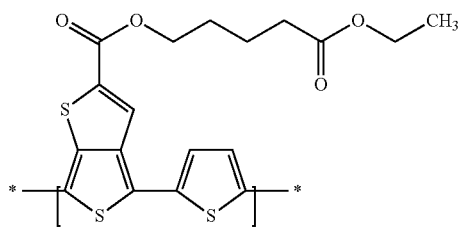

Chemical Formula 9-2

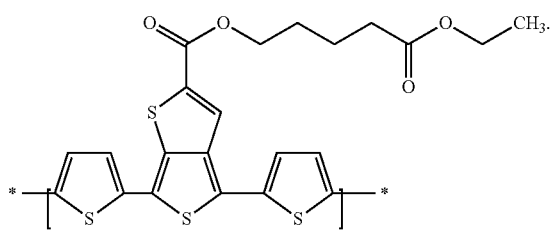

8. The polymer of claim 1, wherein the polymer has a number average molecular weight (Mn) of about 500 g/mol to about 800,000 g/mol.

9. The polymer of claim 8, wherein the polymer has a number average molecular weight (Mn) of about 5,000 g/mol to about 50,000 g/mol.

10. The polymer of claim 1, wherein the polymer has a bandgap of about 1.2 eV to about 2.5 eV.

11. The polymer of claim 10, wherein the polymer has a bandgap of about 1.35 eV to about 1.6 eV.

12. An organic solar cell, comprising:
an anode and a cathode facing each other; and
a photoactive layer between the anode and the cathode, wherein the photoactive layer includes an electron donor including the polymer according to claim 1 and an electron acceptor.

13. The organic solar cell of claim 12, wherein the electron donor includes a p-type semiconductor material, and the electron acceptor includes an n-type semiconductor material.

14. The organic cell of claim 12, wherein the electron acceptor is one selected from a C60 fullerene, a C70 fullerene, a C74 fullerene, a C76 fullerene, a C78 fullerene, a C82 fullerene, a C84 fullerene, a C720 fullerene, a C860 fullerene, 1-(3-methoxy-carbonyl)propyl-1-phenyl(6,6)C61 (PCBM), C71-PCBM, C84-PCBM, bis-PCBM, perylene, an inorganic semiconductor, and combinations thereof.

* * * * *